United States Patent [19]

Tseng

[11] Patent Number: 5,677,222

[45] Date of Patent: Oct. 14, 1997

[54] METHOD FOR FORMING A DRAM CAPACITOR

[75] Inventor: Horng-Huei Tseng, Hsinchu, Taiwan

[73] Assignee: Vanguard International Semiconductor Corporation, Hsinchu, Taiwan

[21] Appl. No.: 728,703

[22] Filed: Oct. 11, 1996

[51] Int. Cl.⁶ .................................................. H01L 21/70
[52] U.S. Cl. .............................. 437/52; 437/60; 437/919
[58] Field of Search ............................... 437/47, 48, 52, 437/60, 919, 228; 156/644.1, 661.11

[56] References Cited

U.S. PATENT DOCUMENTS

| | | | |
|---|---|---|---|
| 5,137,842 | 8/1992 | Chan et al. | 437/48 |
| 5,478,769 | 12/1995 | Lim | 437/52 |
| 5,506,163 | 4/1996 | Moriya | 437/52 |
| 5,545,582 | 8/1996 | Roh | 437/52 |

*Primary Examiner*—John Niebling
*Assistant Examiner*—Joni Y. Chang

*Attorney, Agent, or Firm*—Christensen O'Connor Johnson & Kindness, PLLC

[57] ABSTRACT

An improved method for forming a dynamic random access memory (DRAM) capacitor with increased capacitance is disclosed. The method includes forming an oxide layer on a semiconductor substrate with a metal-oxide-semiconductor field effect transistor (MOSFET) conventionally formed therein and thereon. A planarized silicon nitride layer is then formed on the oxide layer. Then alternating layers of dielectric layers having different etch rates are formed on the silicon nitride layer. Standard photolithographic methods are used to etch a trench through the dielectric layers and the silicon nitride layer to expose the source region of the MOSFET. The trench is then isotropically etched, forming rounded cavities in portions of the dielectric layers having the faster etch rate. The rounded cavities extend horizontally into the sidewalls of the trench. A doped polysilicon layer is then formed on the top of the dielectric layers so as to fill the trench and the rounded cavities. The polysilicon layer is then patterned and etched to removed the polysilicon layer around the trench. The dielectric layers are then removed, thereby forming the bottom electrode of a DRAM cell capacitor.

22 Claims, 9 Drawing Sheets

METHOD FOR FORMING A DRAM CAPACITOR

BACKGROUND OF THE INVENTION

1. Field of the Invention

The present invention relates to dynamic random access memory (DRAM) fabrication, and more particularly to a method for forming a capacitor of a dynamic random access memory cell.

2. Description of the Prior Art

Recently, demand for semiconductor devices has rapidly increased owing to widespread use of electronic equipment. In particular, the increasing popularity of some electronic equipment such as, for example, computers is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are called word lines 11, and the vertical lines connected to all of the cells in the column are referred to as bit lines 13. Data flow into and out of the cells via those bit lines.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18 respectively. The row decoder 16 and the column decoder 18 then respectively select the appropriate word line and bit line corresponding to the received address signal. The word and bit lines select a particular memory cell of the memory 14 corresponding to the received address signals. The row decoder 16 and the column decoder 18 reduce the number of address lines needed for accessing a large number of storage cells in the memory 14.

The array configuration of semiconductor memory 14 lends itself well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type metal-oxide-semiconductor (PMOS) technology. Later, U.S. Pat. No. 3,387,286 titled "Field Effect Transistor Memory" by R. H. Dennard disclosed a DRAM storage cell structure consisting of one transistor and one capacitor. A circuit schematic diagram of this structure is shown in FIG. 2A. The gate of the transistor 20 is controlled by a word line signal, and data represented by the logic level of a capacitor voltage, is written into or read out of the capacitor 22 through a bit line signal. FIG. 2B shows cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes highly integrated, the area occupied by a capacitor of a DRAM storage cell shrinks, thus decreasing the capacitance of the capacitor owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, which achieves both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing its capacitance while maintaining the small area occupied on the substrate surface. Consequently, this type of capacitor has come to be widely used in DRAM devices.

Another consideration in achieving high density memory devices is the limitations of lithography techniques widely used in the semiconductor industry. The so-called "minimum feature size" (i.e., the minimum line-width, contact dimensions, or line-to-line separation that can be formed on the substrate surface) of the photolithographic process limits the number of circuits that can be fabricated on the wafer. The minimum feature size is largely determined by the resolution of an optical imaging system used in the photolithography process. The minimum feature size only can be reduced at the cost of further reducing the depth of focus and restricting the flexibility in the design of three-dimensional structures. Thus, there is a need for a method of forming a DRAM capacitor with features that are smaller than the minimum feature size of the photolithographic process.

SUMMARY OF THE INVENTION

In accordance with the present invention, a method is provided for forming a DRAM capacitor that substantially increases capacitance, reduces dielectric breakdown and increases the mechanical integrity of a capacitor electrode. In one embodiment, a conformal oxide layer is formed on a semiconductor substrate with a metal-oxide-semiconductor field effect transistor (MOSFET) conventionally formed on and in the substrate. A planarized silicon nitride layer is then formed on the oxide layer. Then alternating layers of dielectric layers having different etch rates are formed on the silicon nitride layer. One set of the dielectric layers are formed by chemical vapor deposition (CVD) with an ozone-tetraethylorthosilicate (TEOS) reaction gas, whereas the other set of the dielectric layers are formed by a standard plasma enhanced CVD (PECVD) process using a TEOS reaction gas without ozone. Standard photolithographic methods are used to etch a trench through the dielectric layers and the silicon nitride layer to expose the source region of the MOSFET. The trench is then isotropically etched. The isotropic etching process forms rounded cavities in portions of the ozone-TEOS formed dielectric layers within the sidewalls of the trench. A doped polysilicon layer is then formed on the top of the dielectric layers so as to fill the trench and the rounded cavities within the sidewalls of the trench. The polysilicon layer is then patterned and etched to removed the polysilicon layer around the trench. The dielectric layers are then removed using an HF solution, thereby forming the bottom electrode of a DRAM cell capacitor.

In another embodiment, an additional step is performed before forming the trench in the dielectric layers. In this additional step, a polymer layer is formed on the top and the sidewalls of the photoresist layer by reacting a plasma gas such as $CHF_3$. The polymer on the sidewalls of the photoresist layer is then used as an etch mask in the subsequent etching process used to form the trench in the dielectric layers. As a result, the trench has a width that is smaller than the minimum feature size of the photolithography process. This embodiment is advantageously used to further reduce the size of the capacitor to achieve increased DRAM density.

DESCRIPTION OF THE PREFERRED EMBODIMENTS

Figure 1:
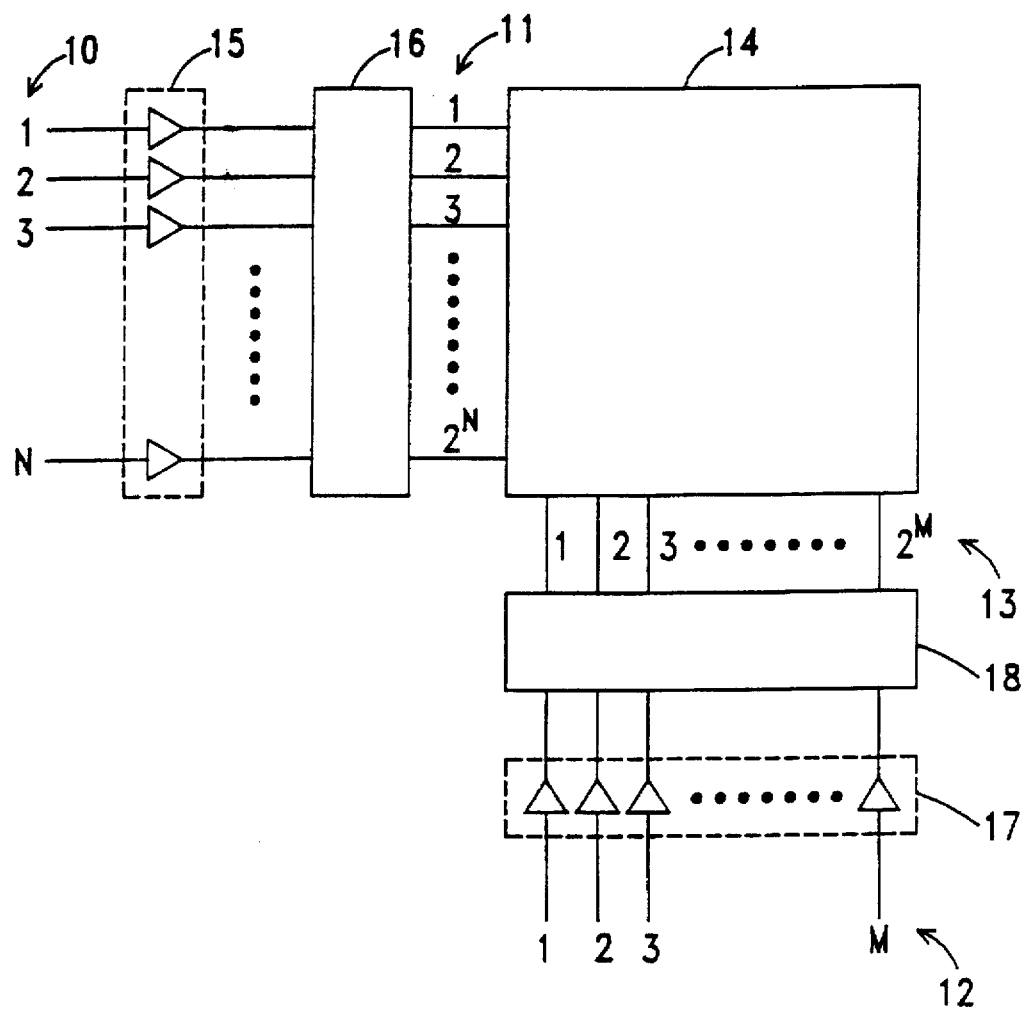
FIG. 1 shows a simplified diagram illustrative of the organization of a typical large semiconductor memory.
Figure 2A:
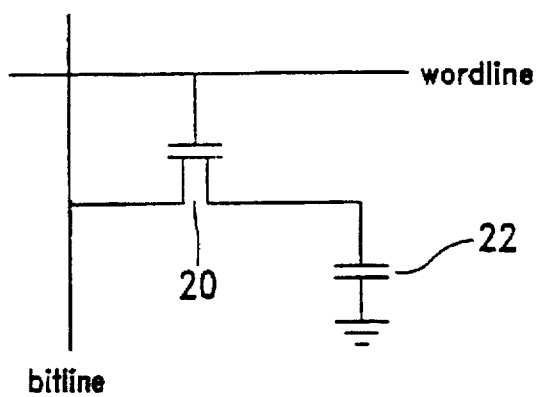
FIG. 2A shows a circuit schematic diagram of a typical one-transistor dynamic random access memory (DRAM) cell.
Figure 2B:
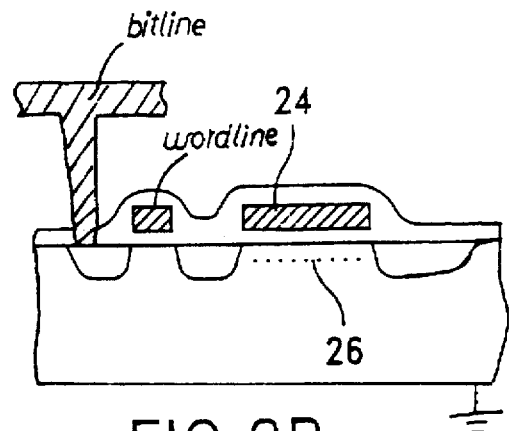
FIG. 2B shows cross-sectional view illustrative of traditional one-transistor DRAM storage cell.
Figure 3:
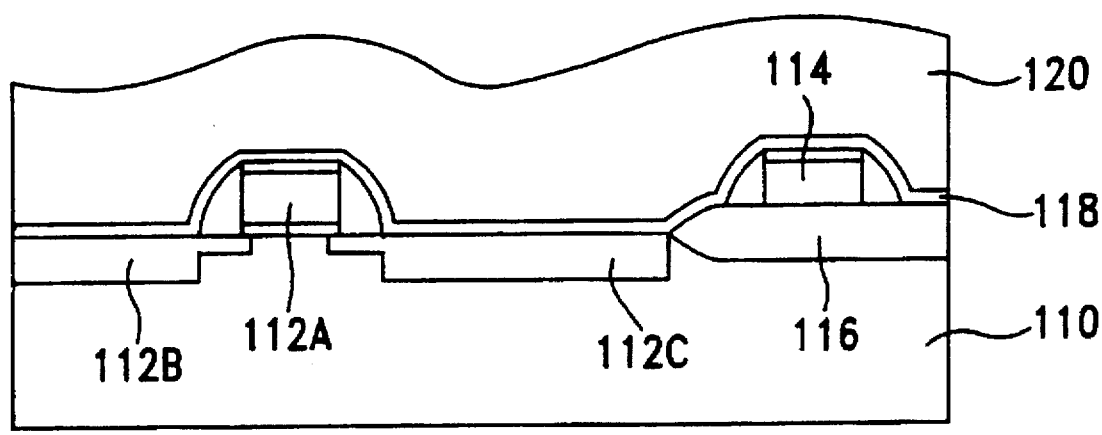
FIGS. 3 to 9 show cross-sectional views illustrative of various stages in the fabrication of a DRAM capacitor in accordance with one embodiment of the present invention.

Referring to FIG. 3, a metal-oxide-semiconductor field effect transistor (MOSFET) having a gate 112A, a drain 112B and a source 112C, is conventionally formed in and on the substrate 110. Further, a word line 114 is formed over a field oxide (FOX) region 116. In this embodiment, the MOSFET is a n-channel MOSFET that forms part of a DRAM cell. A conformal oxide layer 118 is formed using a low pressure chemical vapor deposition (LPCVD) method, typically to a thickness of about 800 to 2000 angstroms. A silicon nitride layer 120 is deposited on the oxide layer 118 using a conventional low pressure chemical vapor deposition (LPCVD) or PECVD process. The thickness of the silicon nitride layer 120 is about 4000 angstroms, but can range about 3000 to 6000 angstroms.

Figure 4:
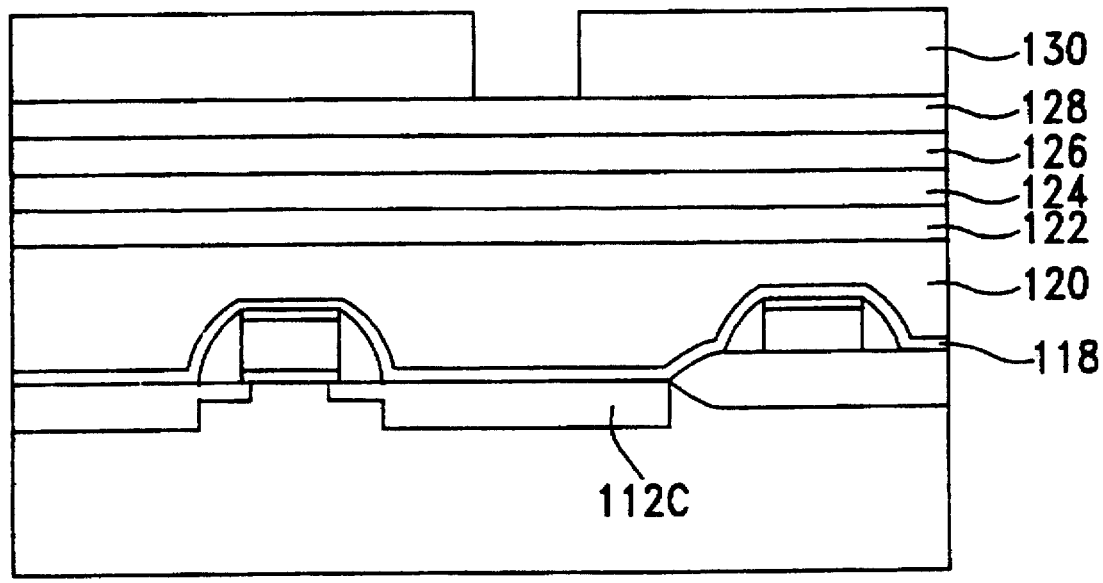

The silicon nitride layer 120 is then planarized using any suitable conventional method such as, for example, an etch back process or a chemical mechanical polishing (CMP) process. As shown in FIG. 4, after planarization of the silicon nitride layer 120, dielectric layers 122, 124, 126 and 128 are formed on the planarized silicon nitride layer 120. In this embodiment, dielectric layers 122 and 126 are formed by a CVD process at about 330°–370° C. using an ozone-TEOS reaction gas as shown by the reaction equation below:

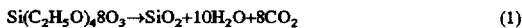

$$Si(C_2H_5O)_4 8O_3 \rightarrow SiO_2 + 10H_2O + 8CO_2 \quad (1)$$

On the other hand, dielectric layers 124 and 128 are formed by a standard LPCVD process using TEOS reaction gas without ozone. The thickness of each dielectric layer is about 200 to 500 angstroms. Accordingly, the dielectric layers 122, 124, 126 and 128 form a dielectric stack with alternating layers of dielectric material.

For many etching processes, the first set of dielectric layers (i.e., the dielectric layers 122 and 126) have an etch rate that is faster than the etch rate of the second set of dielectric layers (i.e., the dielectric layers 124 and 128). In accordance with the present invention, this difference in etch rate is advantageously used to fabricate a DRAM cell capacitor as described below in conjunction with FIG. 6.

Figure 5:
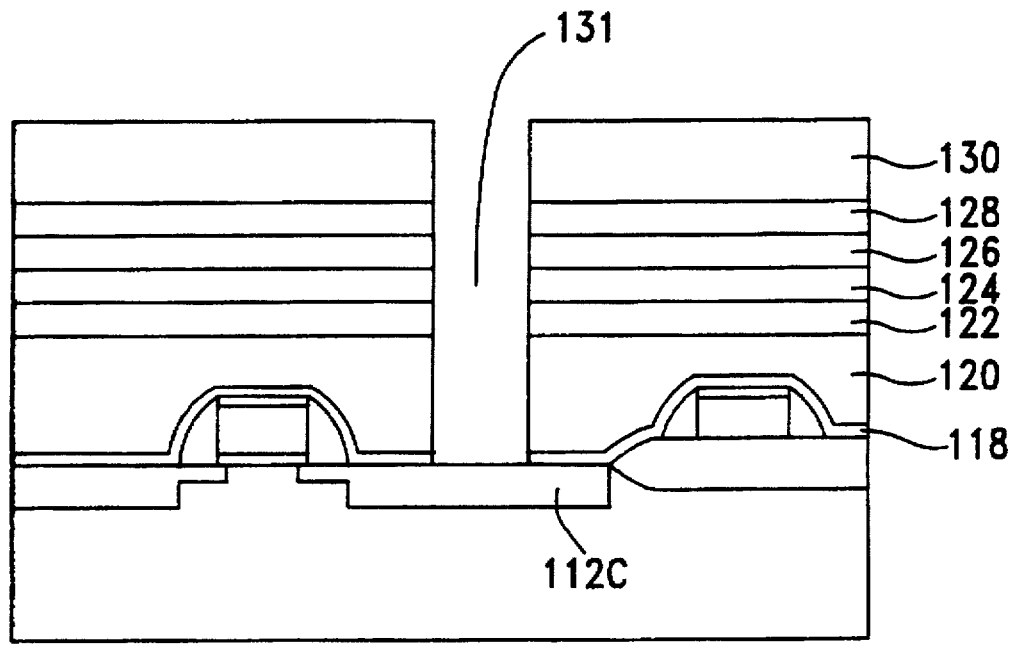

A photoresist layer 130 is then formed and patterned on the dielectric layer 128 using conventional photolithographic techniques, defining a storage node area over a portion of the source 112C. Thereafter, an anisotropic etching process is performed, using the photoresist layer 130 as an etching mask. In this embodiment, the etching process uses a buffered or diluted HF solution for etching the oxide layers 122, 124, 126, 128 and 118, and a heated solution of phosphoric acid, $H_3PO_4$, for etching the nitride layer 120. This etching process forms a trench 131, as shown in FIG. 5, that exposes portion of the source region 112C.

Figure 6:
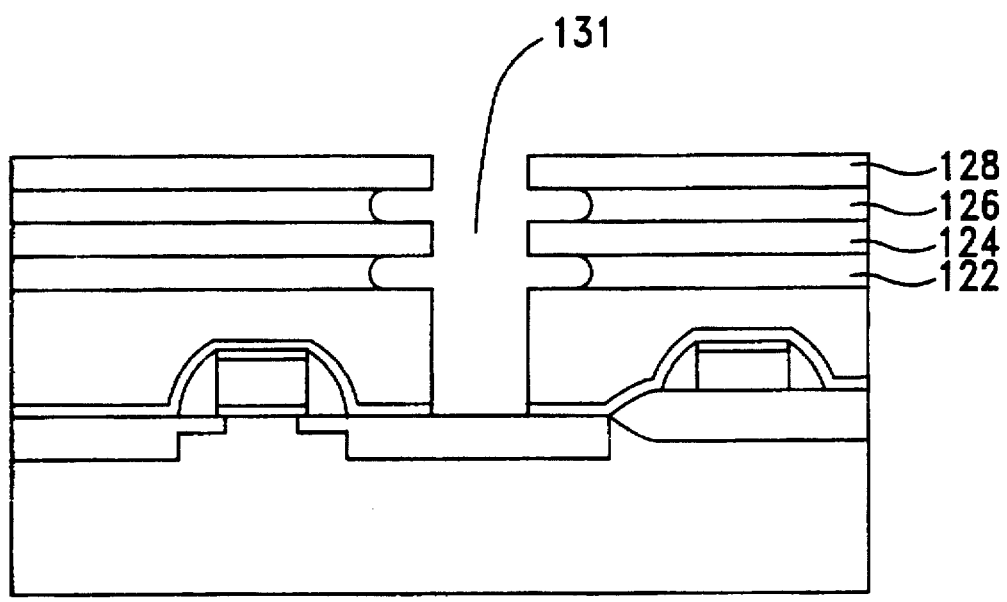

An isotropic etching process is then performed on the dielectric layers 122, 124, 126, and 128. FIG. 6 shows the resulting structure after the isotropic etch of the trench 131. In this embodiment, the isotropic etching process uses a HF solution. This etchant etches the dielectric layers 122 and 126 about ten times faster than the dielectric layers 124 and 128. This isotropic etching process forms rounded and recessed cavities 133 in the dielectric layers 122 and 126 that extend horizontally into the sidewalls of the trench 131. The cavities 133 can extend about 300 to 1000 angstroms into the trench sidewalls.

Although oxide materials with different etch rates are used in this embodiment to form the dielectric layers, it is understood that materials other than those described above can be used in other embodiments, provided one set of dielectric layers has an etch rate significantly different from the etch rate of the other set of dielectric layers. For example, silicon nitride layers can replace dielectric layers 122 and 126. Preferably, the etch ratio of the different materials is about 25 to one, or greater. It is also appreciated that in other embodiments, the number of alternating dielectric layers in the dielectric stack can be varied.

Figure 7:
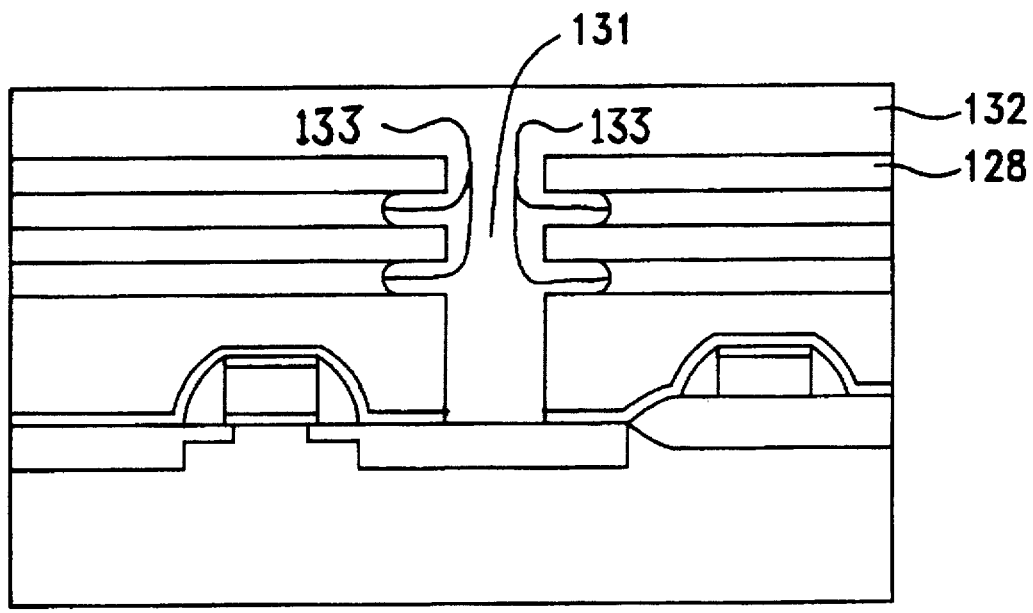

As shown in FIG. 7, a doped polysilicon layer 132 is then formed on the dielectric layer 128 so as to fill the trench 131 and the rounded cavities 133 within the sidewalls of the trench 131. In this embodiment, the polysilicon layer 132 is deposited using a standard LPCVD process and is doped with $p^{31}$ at a concentration of 1E20 atoms/cm$^2$.

Figure 8:
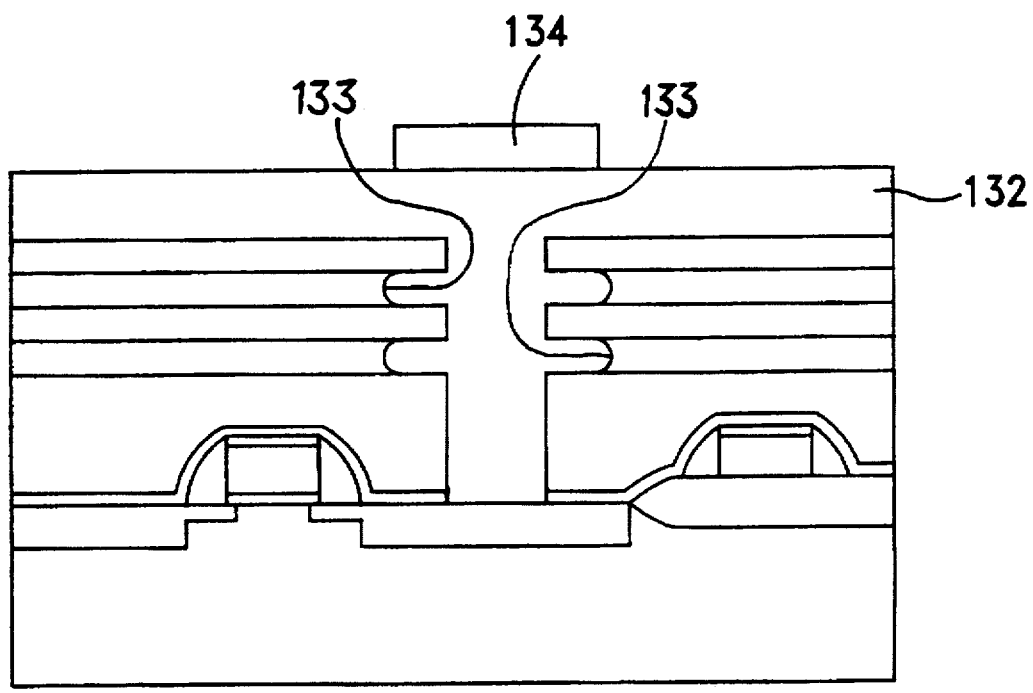

Conventional photolithography techniques are then used to form a photoresist 134 to mask a portion of the polysilicon layer 132 above and near the opening of the trench 131. The resulting structure is shown in FIG. 8. In this embodiment, the photoresist 134 is sized to completely cover the trench 131, including the rounded cavities 133 formed in the sidewalls of the trench. Thereafter, a plasma etching process with an $SF_6/O_2$ etchant is used to remove portions of the polysilicon layer 132 that are not covered by the photoresist 134.

Figure 9:
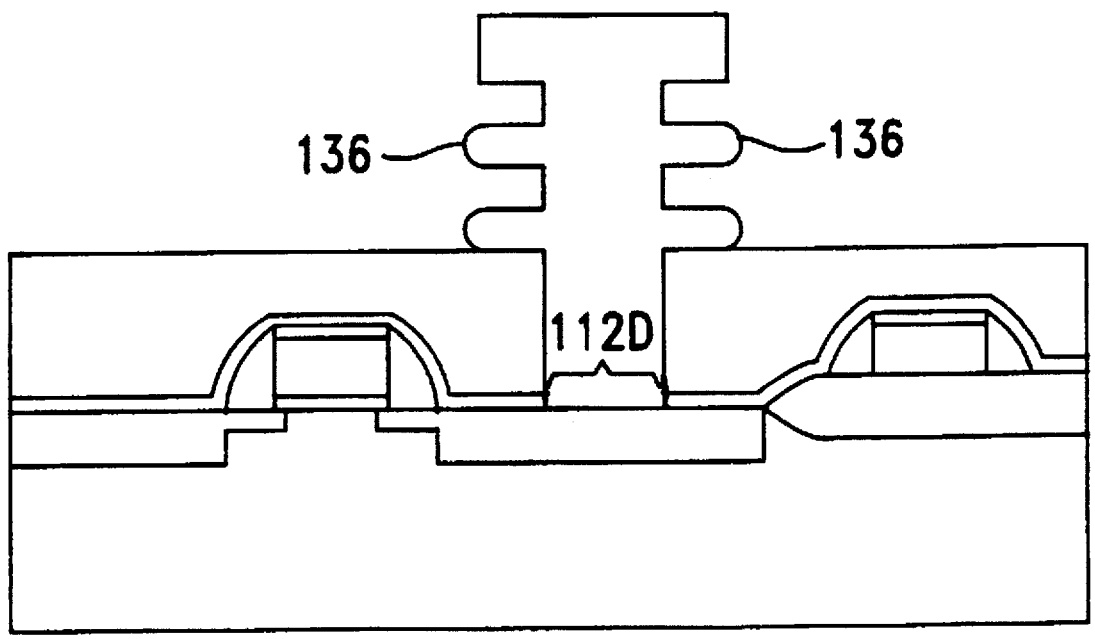

The dielectric layers 122, 124, 126 and 128 are then removed using HF solution, thereby forming the bottom electrode (or plate) of a DRAM cell capacitor. The resulting bottom electrode is illustrated in FIG. 9. The rounded cavities 133 (FIG. 6) form rounded polysilicon fins 136 that extend horizontally from the main vertical structure of the bottom electrode. The rounded fins 136 increase the electrode surface area, thereby increasing the capacitor's capacitance. In addition, the rounded shape of the fins 136 help reduce dielectric breakdown and increase the mechanical integrity of the electrode, compared to conventional fin shapes. The bottom electrode has a very narrow horizontal cross-section as indicated by bracket 112D, thereby causing the capacitor to occupy a relatively small area of the substrate 110. The dielectric film and the top electrode (not shown) of the DRAM cell capacitor can then be formed in the conventional manner after removing the silicon nitride layer 120.

Figure 10:
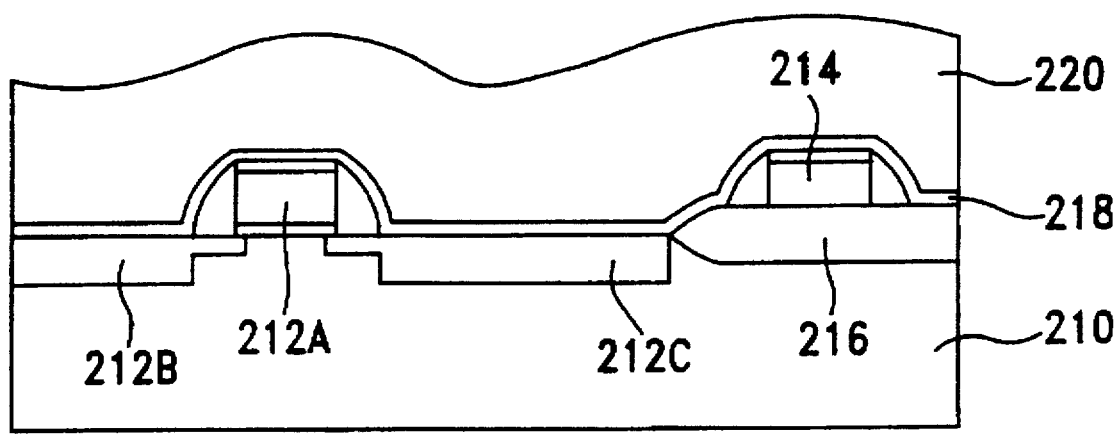
FIGS. 10 to 17 show cross-sectional views illustrative of various stages in the fabrication of a DRAM capacitor in accordance with another embodiment of the present invention.

FIGS. 10 to 17 illustrate the process of forming a DRAM capacitor according to another embodiment of the present invention. Referring to FIG. 10, a MOSFET having a gate 212A, a drain 212B and a source 212C is conventionally formed in and on the substrate 210. Further, a word line 214 is formed over a field oxide (FOX) region 216. In this embodiment, the MOSFET is a n-channel MOSFET that forms part of a DRAM cell. A conformal oxide layer 218 is formed using a LPCVD method, typically to a thickness of about 500 to 2000 angstroms. A silicon nitride layer 220 is then deposited oxide layer 218 using a conventional PECVD process. The thickness of the silicon nitride layer 220 can be about 3000 to 6000 angstroms.

Figure 11:
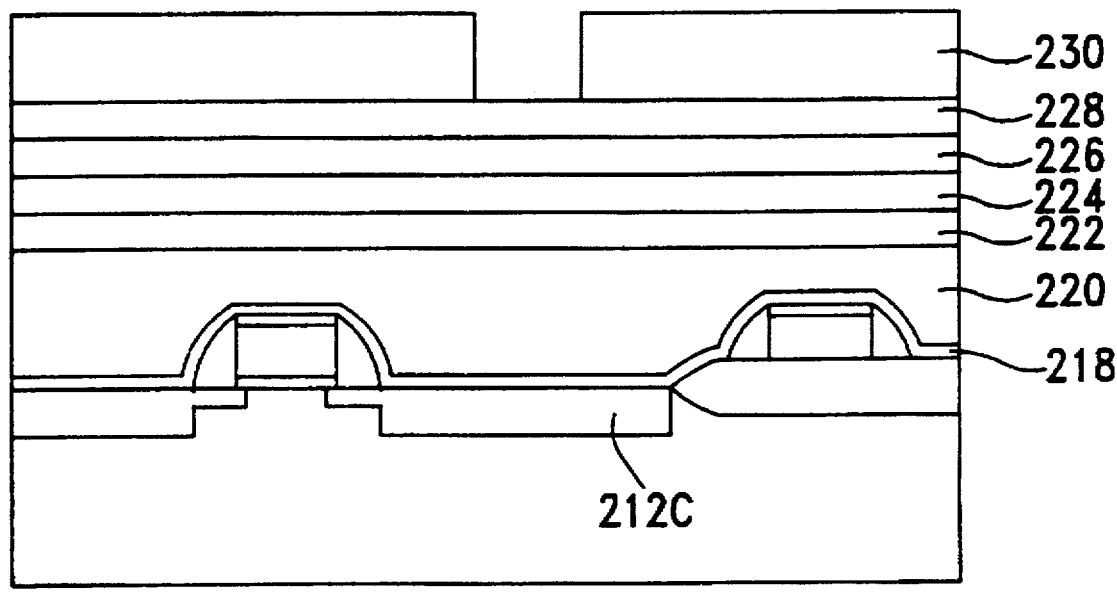

As shown in FIG. 11, after planarization of the silicon nitride layer 220, dielectric layers 222, 224, 226 and 228 are formed on the planarized silicon nitride layer 220. In this embodiment, dielectric layers 222 and 226 are formed by a CVD process using an ozone-TEOS reaction gas as described by Equation 1 above.

Another set of dielectric layers (i.e., layers 224 and 228) are formed by a traditional PECVD process using TEOS reaction gas without ozone. For certain etching processes, the dielectric layers 222 and 226 thus formed possess a faster etch rate than the etch rate of the dielectric layers 224 and 228. The thickness of each dielectric layer is about 200 to 500 angstroms. Accordingly, the dielectric layers 222, 224, 226 and 228 form a dielectric stack with alternating layers of two dielectric materials having different etch rates.

Conventional photolithographic techniques are then used to define a storage node area in the photoresist layer 230, over a portion of the source 212C. In this embodiment, the storage node area is sized to be at or near the minimum dimensions supported by the photolithographic process.

Figure 12:
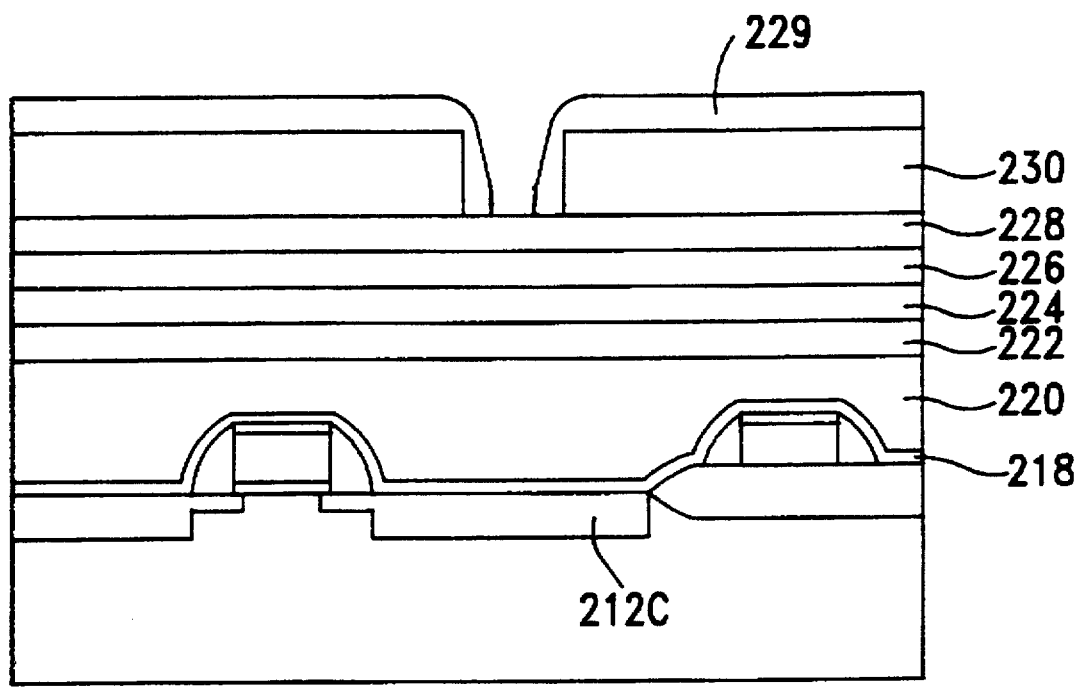

A plasma gas such as $CHF_3$ and HBr is then reacted with the photoresist layer 230 to form a polymer layer 229 on the top surface and the sidewalls of the photoresist layer 230. In this embodiment, the polymer layer 229 has a width of about 500 to 1500 angstroms. The polymer layer 229 on the sidewalls of the photoresist layer 230 serves an etching mask that has a sub-minimum dimension opening. The resulting structure is shown in FIG. 12.

Figure 13:
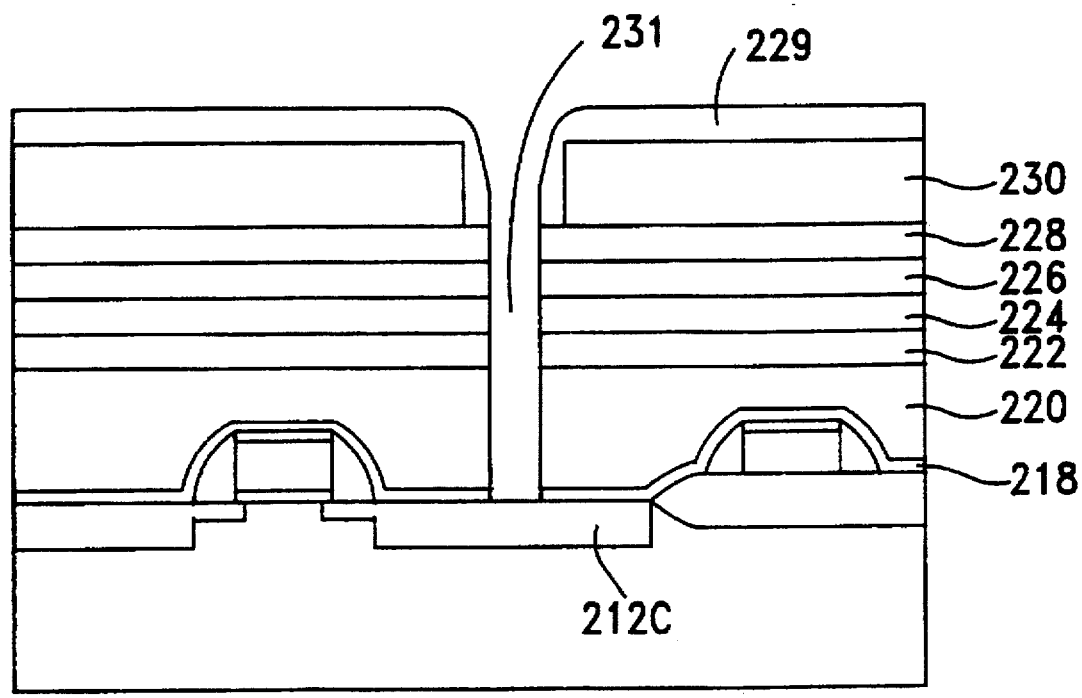

Afterwards, an anisotropic etching process is performed, using the polymer layer 230 as an etching mask. This etching process uses a heated solution of phosphoric acid, $H_3PO_4$, for etching the nitride layer, and a buffered or diluted HF solution for etching the oxide layers. As shown in FIG. 13, after this etching process, a trench 231 is formed that exposes a portion of the source region 212C. The polymer layer 229 is then removed by a conventional etch method using an etchant such as $H_2SO_4$. The width of the trench 231 is smaller than the trench 131 (FIG. 5), thereby further increasing the density that is possible in manufacturing DRAM devices.

Figure 14:
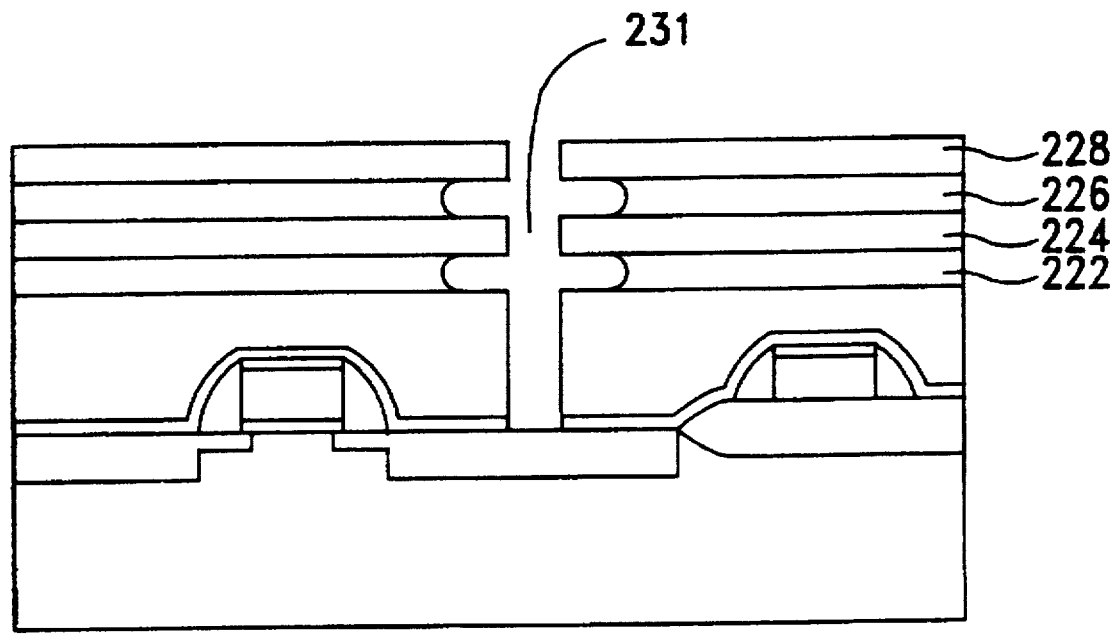

An isotropic etching process is then performed on the dielectric layers 222, 224, 226, and 228. In this embodiment, an etchant including HF solution is used, which etches the dielectric layers 222 and 226 about ten times faster than the dielectric layers 224 and 228. Because of this etch rate differential, this isotropic etching process forms rounded and recessed cavities in the dielectric layers 222 and 226, while the dielectric layers 224 and 228 remain relatively intact. The rounded cavities in the dielectric layers 222 and 226 extend horizontally into the sidewalls of the trench 231. FIG. 14 shows the resulting structure.

Figure 15:
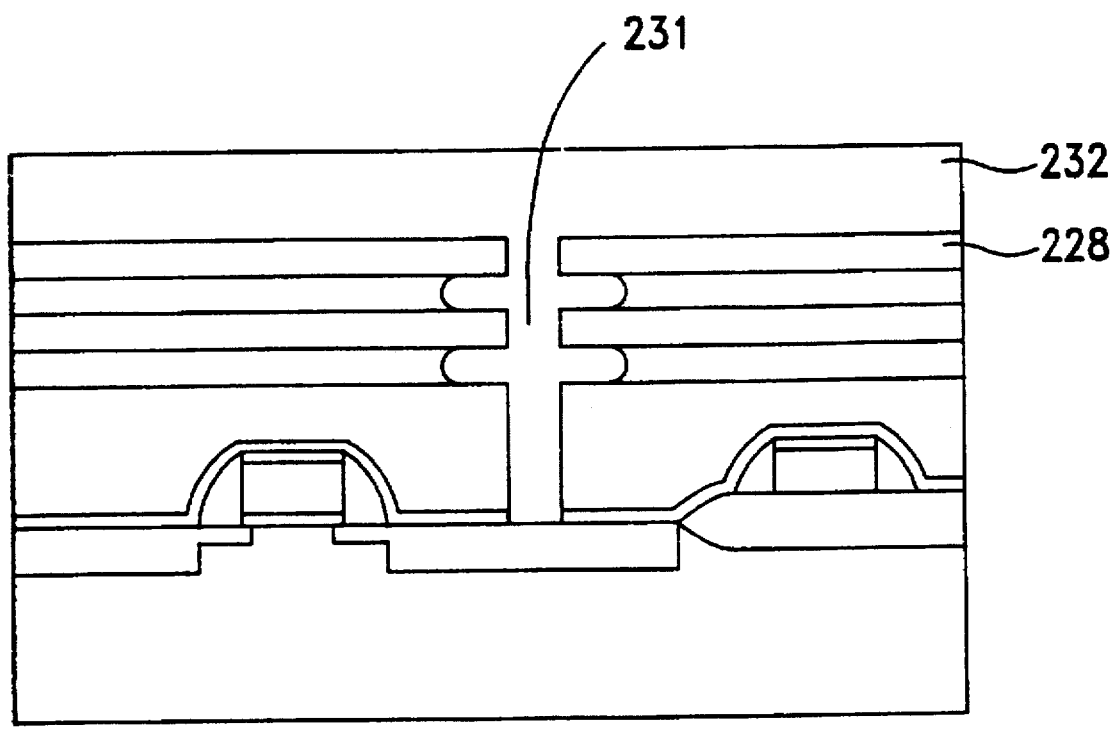

A doped polysilicon layer 232, shown in FIG. 15, is then formed on the dielectric layer 228. A LPCVD process is used to deposit the doped polysilicon layer 232 formed on the dielectric layer 228 so as to fill the trench 231 and the rounded cavities. The doped polysilicon layer 232 is doped using $P^{31}$ at a concentration of about 1E21 atoms/cm$^2$ to increase conductivity.

Figure 16:
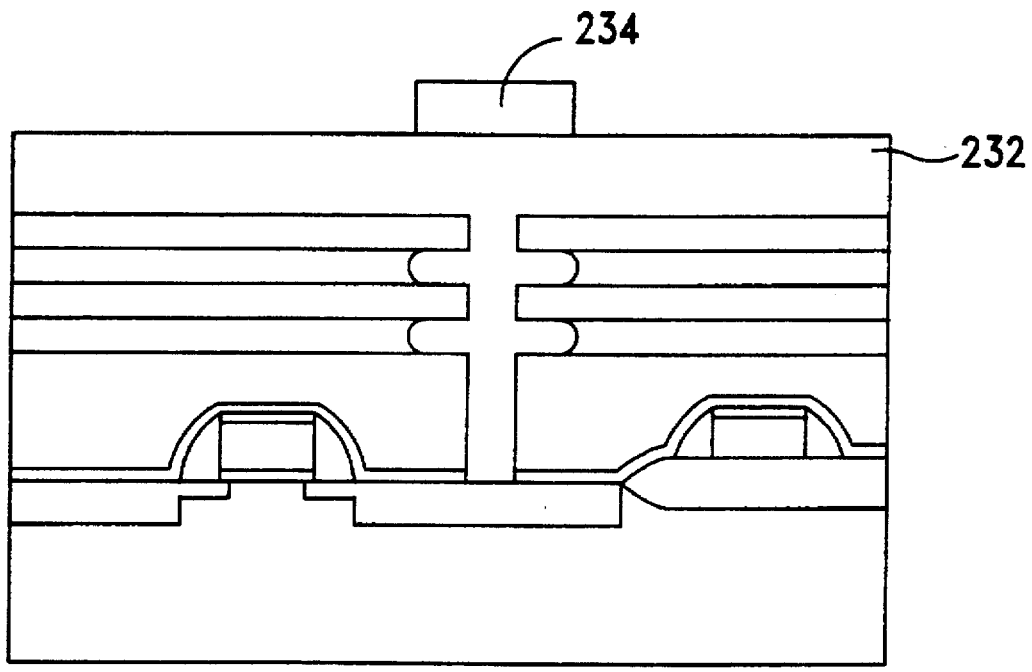
Figure 17:
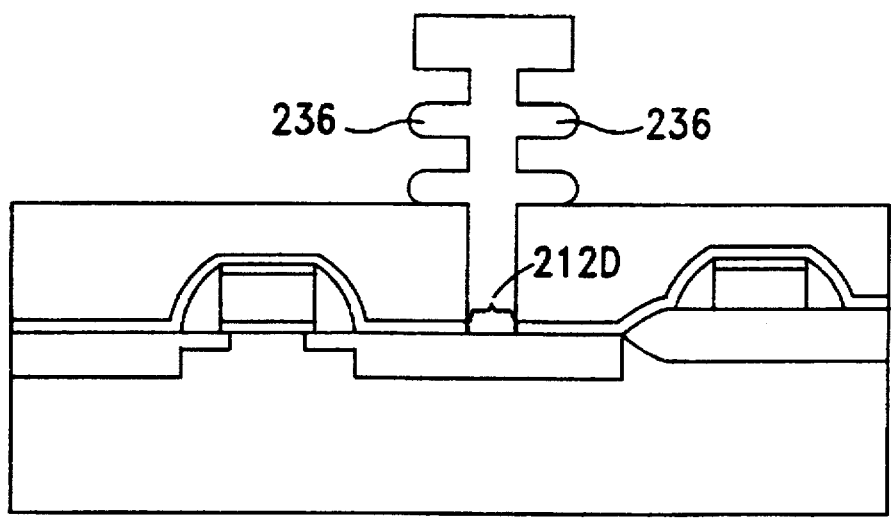

Conventional photolithography techniques are then used to form a photoresist 234 to mask a portion of the polysilicon layer 232 near the opening of the trench 231. The resulting structure is shown in FIG. 16.

Then a plasma etching process using a $SF_6/O_2$ etchant is performed to etch portions of the polysilicon layer 232 that are not covered by the photoresist 234. The dielectric layers 222, 224, 226 and 228 are then removed using a HF solution, thereby forming the bottom electrode (or plate) of a DRAM cell capacitor, shown in FIG. 17. The rounded fins 236 thus formed increase the electrode surface area, thereby increasing the capacitance. In addition, the rounded shape of the fins 236 help reduce dielectric breakdown and increase the mechanical integrity of the electrode relative to conventional fin shapes. The bottom electrode has a very narrow cross-section, as indicated by the bracket 212D, thereby causing the capacitor to occupy a relatively small area of the substrate 210.

To complete the fabrication of the DRAM cell capacitor, the nitride layer 220 is then optionally removed using a conventional phosphoric acid wet etch. A capacitor dielectric layer, such as tantalum oxide or oxide/nitride/oxide, is then formed on the bottom electrode. Then a doped polysilicon layer is then deposited on the capacitor dielectric layer, to form the upper electrode. The upper electrode can then be patterned and etched as desired.

Although specific embodiments, including the preferred embodiment, have been illustrated and described, in view of the present disclosure, it will be appreciated by those skilled in the art that various modifications may be made without departing from the spirit of the invention which is intended to be limited solely by the appended claims.

What is claimed is:

1. A method for forming a capacitor of a dynamic random access memory cell, said method comprising:

forming an oxide layer on a substrate;

forming a nitride layer on said oxide layer;

forming a dielectric stack over said nitride layer, said dielectric stack comprising alternating layers of first dielectric material and a second dielectric material, the first dielectric material possessing a first etch rate and the second dielectric material possessing a second etch rate, wherein the first etch rate is different from the second etch rate;

forming a photoresist layer on the dielectric stack, wherein said photoresist layer defines a storage node area over a portion of said substrate;

removing portions of said dielectric stack, said nitride layer and said oxide layer to form a trench, said portions of said dielectric stack, said nitride layer and said oxide layer being left uncovered by said photoresist layer;

removing said photoresist layer;

isotropically etching said dielectric stack to form recessed cavities in a sidewall of the trench in said dielectric stack;

forming a doped polysilicon layer over said dielectric stack, said doped polysilicon layer filling the trench and the recessed cavities;

removing portions of said doped polysilicon layer surrounding a top opening of the trench; and removing the dielectric stack, thereby forming an electrode of the capacitor of the dynamic random access memory cell.

2. The method according to claim 1, wherein said substrate includes a metal-oxide-semiconductor transistor, said metal-oxide-semiconductor transistor being a part of the dynamic random access memory cell.

3. The method according to claim 1, further comprising planarizing said nitride layer.

4. The method according to claim 1, wherein said first dielectric material comprises an oxide formed by a thermal chemical vapor deposition method using ozone-tetraethylorthosilicate reaction gas.

5. The method according to claim 4, wherein said dielectric layer possessing the second etch rate is formed by a plasma enhanced chemical vapor deposition method using tetraethylorthosilicate (TEOS) reaction gas.

6. The method according to claim 5, wherein said first etch rate is larger than said second etch rate.

7. The method according to claim 6, wherein said rounded cavities are formed in layers of said first dielectric material.

8. The method according to claim 1, wherein said first dielectric material comprises silicon nitride.

9. The method according to claim 1, wherein said isotropically etching said dielectric stack comprises etching said dielectric stack by a wet etch method using a HF solution etchant.

10. The method according to claim 1, wherein said removing said dielectric stack comprises etching the dielectric stack using a HF solution etchant.

11. A method for forming a capacitor of a dynamic random access memory cell, said method comprising:

forming an oxide layer on a substrate;

forming a nitride layer on said oxide layer;

forming a dielectric stack over said nitride layer, said dielectric stack comprising alternating layers of first dielectric material and a second dielectric material, the first dielectric material possessing a first etch rate and the second dielectric material possessing a second etch rate, wherein the first etch rate is different from the second etch rate;

forming a photoresist layer on the dielectric stack, wherein said photoresist layer defines a storage node area over a portion of said substrate;

forming a polymer layer on a top surface and a sidewall of the photoresist layer by reacting said photoresist layer with a plasma gas;

removing portions of said dielectric stack, said nitride layer and said oxide layer to form a trench, said portions of said dielectric stack, said nitride layer and said oxide layer being left uncovered by said polymer layer;

removing said polymer layer;

removing said photoresist layer;

isotropically etching said dielectric stack to form recessed cavities in a sidewall of the trench in said dielectric stack;

forming a doped polysilicon layer over said dielectric stack, said doped polysilicon layer filling the trench and the recessed cavities;

removing portions of said doped polysilicon layer surrounding a top opening of the trench; and removing the dielectric stack, thereby forming an electrode of the capacitor of the dynamic random access memory cell.

12. The method according to claim 11, wherein said substrate includes a metal-oxide-semiconductor transistor, said metal-oxide-semiconductor transistor being a part of the dynamic random access memory cell.

13. The method according to claim 11, further comprising planarizing said nitride layer.

14. The method according to claim 11, wherein said first dielectric material comprises an oxide formed by a chemical vapor deposition method using ozone-tetraethylorthosilicate reaction gas.

15. The method according to claim 14, wherein said dielectric layer possessing the second etch rate is formed by a plasma enhanced chemical vapor deposition method using tetraethylorthosilicate reaction gas.

16. The method according to claim 15, wherein said first etch rate is larger than said second etch rate.

17. The method according to claim 16, wherein said rounded cavities are formed in layers of said first dielectric material.

18. The method according to claim 11, wherein said first dielectric material comprises silicon nitride.

19. The method according to claim 11, wherein said isotropically etching said dielectric stack comprises etching said dielectric stack by a wet etch method using a HF solution etchant.

20. The method according to claim 11, wherein said removing said dielectric stack comprises etching the dielectric stack using a HF solution etchant.

21. The method according to claim 11, wherein said plasma gas comprises $CHF_3$ and HBr.

22. The method according to claim 11, wherein said removing said polymer layer comprises etching said polymer layer using $H_2SO_4$ etchant.

* * * * *